United States Patent [19]
Campisi

[11] Patent Number: 4,551,913
[45] Date of Patent: Nov. 12, 1985

[54] COMPONENT DELIVERY SYSTEM

[75] Inventor: Carl Campisi, Chicago, Ill.

[73] Assignee: Zenith Electronics Corporation, Glenview, Ill.

[21] Appl. No.: 501,955

[22] Filed: Jun. 7, 1983

[51] Int. Cl.⁴ ............................................. H05K 3/30
[52] U.S. Cl. ...................................... 29/740; 29/759; 198/409; 414/224; 414/749
[58] Field of Search .................. 29/740, 759, 809, 840; 198/409; 414/222, 224, 18, 749

[56] References Cited
U.S. PATENT DOCUMENTS 4,372,802 2/1983 Harigane et al. ................. 29/740 X
4,387,796 6/1983 Enomae .............................. 198/374

FOREIGN PATENT DOCUMENTS 1051192 12/1966 United Kingdom ................ 414/224

Primary Examiner—Howard N. Goldberg
Assistant Examiner—Timothy V. Eley

[57] ABSTRACT

A component delivery system for an automatic insertion mechanism comprises a chute for sequential delivery of components to a platform with a given orientation. A receiver is positioned at the end of the platform for reception of the component when pushed off the platform by operation of an air valve. The receiver includes mounting means, cooperating with the mounting means of the component, that are substantially identical to the component mounting means on the circuit board. The receiver is pivoted into a horizontal position by another air valve, thus presenting the component with a precise orientation to insertion means.

6 Claims, 10 Drawing Figures

COMPONENT DELIVERY SYSTEM

BACKGROUND OF THE INVENTION AND PRIOR ART

This invention relates generally to automated manufacturing systems and specifically to such systems used in the electronics industry for electrically and mechanically attaching components in proper position on printed circuit boards.

It has long been known to use automatic positioning equipment for installation of simple electrical components, such as resistors and capacitors, in predrilled holes in appropriate locations on printed circuit boards. In such systems a conveyer carries the board to sequentially arranged work stations where there were one or more numerically controlled insertion machine heads for appropriately attaching one or more components to the board. The components were often packaged in circular magazines for sequential feeding to the insertion heads, which generally included means for cutting and forming the component leads prior to insertion in the predrilled holes. The prior art did not have an economical way of automatically inserting components that did not have a simple arrangement of leads.

In the rapidly growing field of robotics, the principles incorporated in the early automatic insertion equipment have been extended to more diverse and complicated tasks. Yet, there still exists a need in the art for a simple, reliable component delivery system for properly orienting components at a work station for subsequent pick-up and placement by automated equipment into appropriate locations on electronic printed circuit boards.

OBJECTS OF THE INVENTION

A principal object of this invention is to provide a novel component delivery system.

Another object of this invention is to provide an improved component delivery system for use with automatic insertion equipment.

SUMMARY OF THE INVENTION

In accordance with the invention, an automated assembly system includes a plurality of components having first mounting means, conveyor means carrying a circuit board to a work station, second mounting means, on the circuit board and cooperating with the first mounting means, for mechanically and electrically attaching the components to the board, insertion means for moving components from the work station and placing them into position on the circuit board, and means for presenting the components to the insertion means in a precise orientation including; a chute delivering the components in a given orientation to a platform at the work station, a pivotably mounted receiver adjacent to the platform, means sequentially moving components from the platform into engagement with the receiver and means pivotably moving the receiver and the components into the precise orientation.

BRIEF DESCRIPTION OF THE DRAWINGS

Further objects and advantages of the invention will become apparent by reading the following description in conjunction with the drawings in which.

DESCRIPTION OF THE PREFERRED EMBODIMENT

Figure 1:
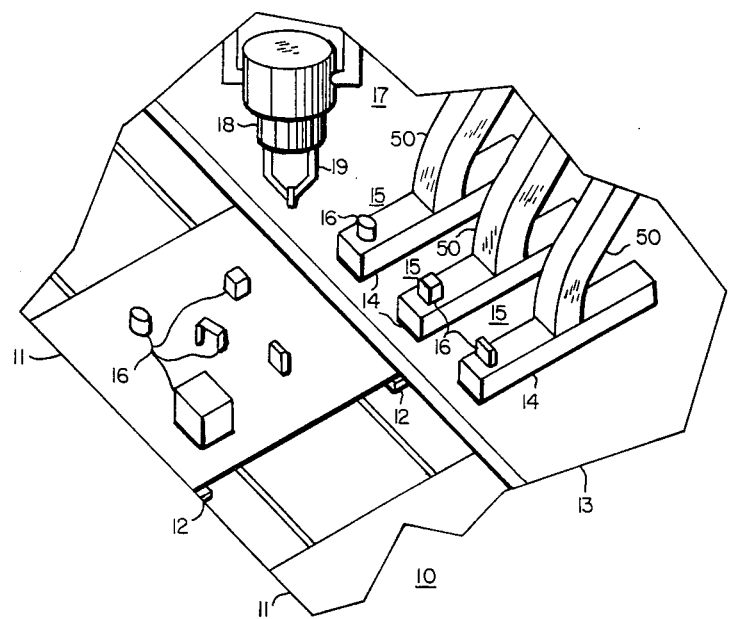
FIG. 1 shows a partial automated assembly system with component delivery means constructed in accordance with the invention.

Referring to FIG. 1, a conveyor 10 is illustrated for carrying one or more printed circuit boards 11 alongside a surface 13 to a plurality of work stations, indicated generally by reference numeral 14, where the board is stopped and one or more components 16 are inserted by automatic insertion means 17 in appropriate predrilled holes in the board. The boards are precisely indexed at the work stations by suitable index means 12 so that their orientation with respect to the work station is particularly and precisely known. Three delivery means 15 are shown positioned at work stations 14 for delivering, via chutes 50, components 16 with precise orientations for subsequent pick-up and insertion, via the head 18 and grippers 19 of insertion means 17, in properly prepared holes in the appropriate one of circuit boards 11. The grippers on the insertion means physically grasp the components and carry them from the work stations to preselected locations where they are electrically and mechanically attached to the printed circuit boards. As is generally illustrated, the components may be of different size and configuration. The techniques and apparatus for physically moving the components from their precise orientation at the work stations to their appropriate positions on the circuit boards and for physically inserting them thereat are all well known and do not constitute a part of this invention. This invention is directed specifically to the means for positioning the components with a precise predetermined orientation at the work stations.

Figure 2:
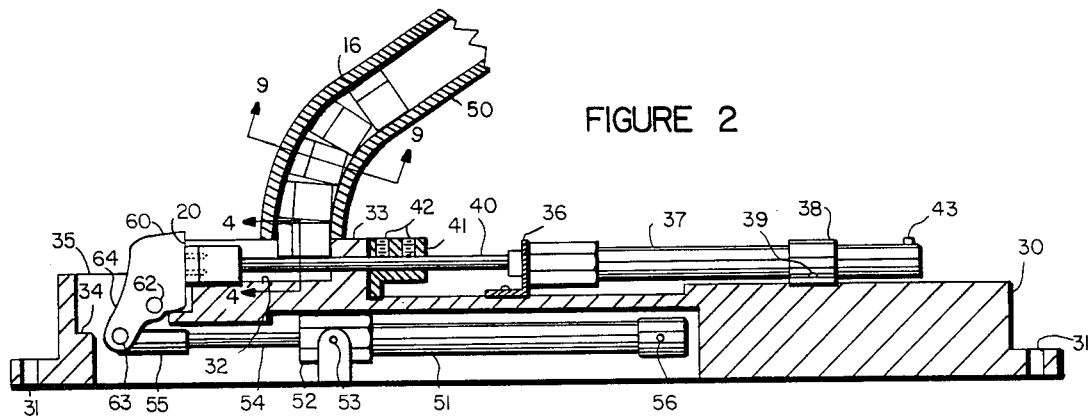
FIG. 2 represents a sectional side elevation of the component delivery means of FIG. 1.
Figure 3:
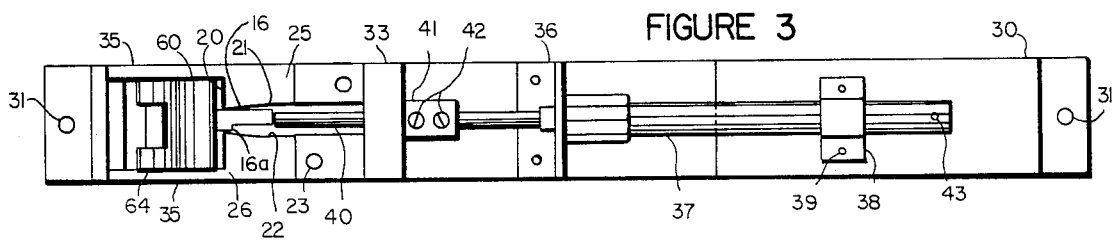
FIG. 3 is a plan view of the component delivery means of FIG. 2.
Figure 4:
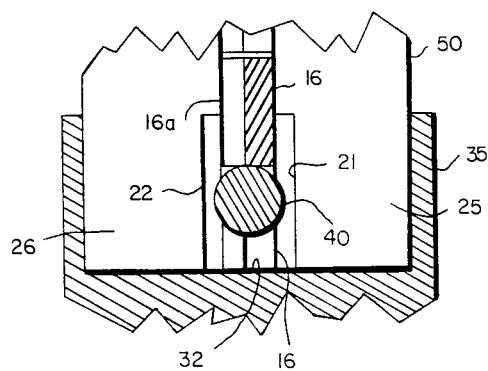
FIG. 4 is a partial view taken along line 4—4 of FIG. 2.

FIGS. 2, 3 and 4 are a side view, top view and partial sectional view of the delivery means of the invention and will be discussed together for convenience. A heavy metal base 30 includes stepped down portions at each end defining mounting apertures 31 for conveniently and firmly mounting the delivery means on a surface adjacent to the conveyor. Base 30 includes a platform 32 for reception of a component 16 from a chute 50, preferably delivered by gravity. The chute is removably secured to base 30 by any suitable means, such as pins 23. A stop 33 is formed above platform 32 and journalled for sliding reception of a cylindrical armature 40 of a first air valve 37. The air valve is secured to the base by a right angle bracket 36 and a clamp 38 having suitable fasteners 39. A guide 41 is secured in position on armature 40 by means of set screws 42 and serves to determine, in conjunction with stop 33, the forward travel of armature 40, which moves in response to application of suitable air pressure to air inlet 43. Base 30 also includes a cutout partially defined by side walls 35 in which a receiver 60 is mounted for pivotal movement, between a pair of stops 20 and 34, about a pivot pin 62 in response to forces exerted on a clevis portion 64, affixed to a drive pin 63. Vertical stop 20 and horizontal stop 34 may be machined surfaces on the base. They cooperate with suitable surfaces on the front and rear of receiver 60 to provide positive position location for the receiver. Drive pin 63 is journalled on a drive link 55 secured to the end of the armature 54 of a second air valve 51. The second air valve includes a swivel mount 52 which is supported on a pivot 53 secured to the base and also includes an air inlet 56 connectable to a suitable source of air pressure.

As best seen in FIG. 3, receiver 60 is nested between side walls 35 of base 30. Component 16 includes a shoulder 16a that is useful in helping assure its correct orientation when entering chute 50. A pair of insert members 25 and 26 form tapered guide walls 21 and 22, respectively, in base 30 which help guide component 16 in its travel into engagement with suitable guide pins 61 on receiver 60 under the driving force of armature 40. It will be appreciated that the invention contemplates the substitution of different insert members to form guide walls 21 and 22 in accordance with the configuration of the particular component being handled by the delivery system. Thus, for example, if a component 16 of much wider dimension were employed, not only would chute 50 have a different internal configuration, but a different pair of insert members 25 and 26 would be used to establish guide walls 21 and 22 to accommodate the wider configuration of the component. In other respects, with the exception of the guide pins on the receiver itself, the structure is essentially the same for use with components of different configuration.

In operation, components 16 are gravity fed from chute 50 to platform 32. It should be noted at this point that means (not shown) are provided at the inlet end of chute 50 for entry of components 16 with the proper orientation. As has been alluded to above, the physical dimensions of components 16 and the internal configuration of the chute are such as to preclude component entry into the chute except with the proper orientation.

Figure 5:
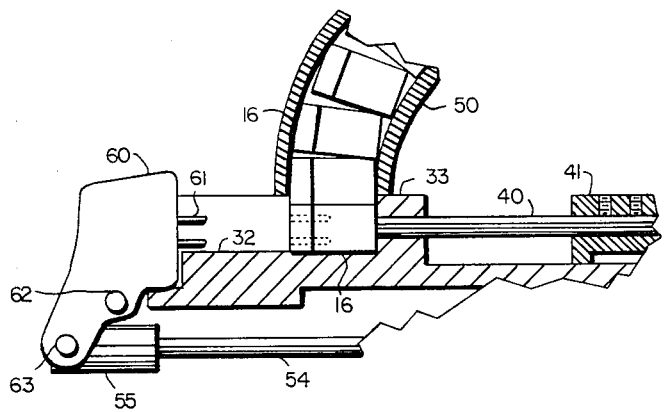
FIG. 5 is a partial view illustrating delivery of components to the platform.
Figure 6:
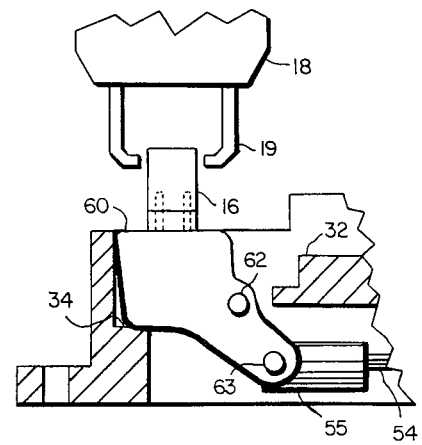
FIG. 6 is a partial view showing a component presented with a precise orientation for pick-up by the insertion means.

It will be obvious to those skilled in the art that air valves 37 and 51 are programmed to operate in conjunction with movement of the gripper on the insertion head. Assume that in the rest position, illustrated in FIG. 5, armature 40 of air valve 37 is withdrawn and armature 54 of air valve 51 is extended. Receiver 60 is in its vertical position with its front engaging stop 20 ready to receive the bottom component 16 that has been discharged from chute 50 and is resting on platform 32. Operation of air valve 37 drives armature 40 forward to its extended position, thus pushing the bottom one of components 16 on platform 32 into engagement with the guide pins 61 on the receiver. The remainder of the components in the chute drop with the next lowest one resting on armature 40, which is still extended. As air valve 37 is deactivated, armature 40 withdraws and the component stack drops to platform 32. Air valve 51 is then actuated to withdraw its armature and pull receiver 60, with component 16 firmly secured thereto, into its horizontal position (FIG. 6) with its back against stop 34, thus presenting component 61 in a precise orientation for the insertion means grippers. During this movement, it will be appreciated that air valve 51 experiences a "rocking" motion about pivot 53 because of the change in lever arm between pivot pin 62 and drive pin 63 as the receiver is rotated. At this juncture the insertion means are activated as indicated above to remove the component from receiver 60. Air valve 51 is operated to withdraw armature 54 and return receiver 60 to its vertical position.

Figure 7:
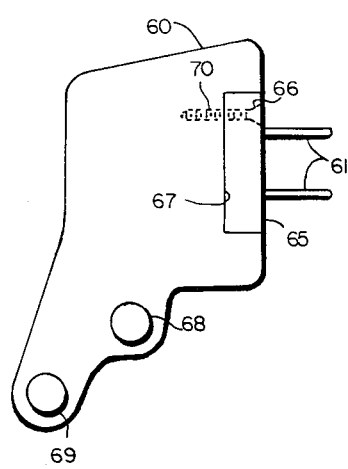
FIG. 7 is an enlarged view of the receiver illustrating its removable insert.
Figure 8:
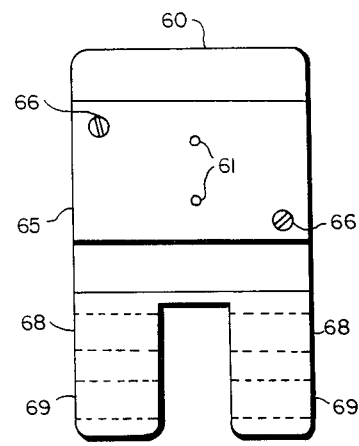
FIG. 8 is an end view of the receiver illustrating the face of the insert.

In FIG. 7 an enlarged view of receiver 60 shows a rectangular cutout 67 formed in its face for reception of any of a plurality of interchangeable inserts 65 which are secured therein by means of machine screws 66 and corresponding tapped holes 70. As more clearly illustrated in FIG. 8, the two guide pins 61 are substantially centered on insert 65 for use with the particular one of components 16 employed. It will thus be appreciated that removal of screws 66 will permit a different insert configuration for use with appropriately different components. The clevis portion of the receiver is illustrated as including a pair of legs with aligned pivot pin apertures 68 and drive pin apertures 69 formed therethrough for reception of appropriate ones of pins 62 and 63, respectively.

The electrical components involved will generally include connector pins, tabs or sockets in different arrangements, all of which are referred to generally as mounting means. It will be appreciated that the dimensions of the component body may vary substantially as will the actual location of the mounting means with respect thereto. The critical factor in automatic insertion is that the mounting means of the component and the corresponding mounting means on the circuit board must mate with each other. The mounting means on the circuit board will generally be the opposite of the pin tab or socket mounting means of the component. With the invention, the component is positioned at the work station with its guide pins (mounting means) in a precise orientation irrespective of minor dimensional variations in the component housing, thus permitting the insertion means to be readily programmed for accurate placement of the components in the circuit boards.

Figure 9:
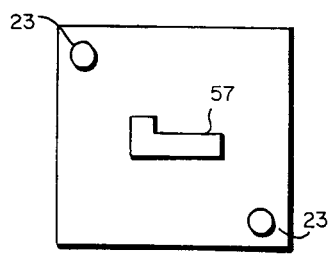
FIG. 9 is a view of the chute taken along line 9—9 of FIG. 2.

In FIG. 9, a sectional view of chute 50 illustrates its internal configuration 57 for accommodating the shoulder 16a of the component which allows the component to be inserted in the chute with only one orientation. A suitable internal configuration may be used with each different-shaped component to assure that components fed to the chute by conventional automatic feeder devices (not illustrated) enter the chute with the proper orientation. Pins 23 are used to properly position the chute on base 30.

Figure 10:
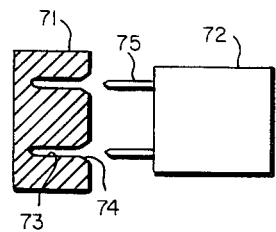
FIG. 10 illustrates a different insert for the carrier for use with a component having terminal pins.

In FIG. 10 an insert 71 for receiver 60 is shown for use with a component 72 having terminal pins 75, rather than sockets. The corresponding socket configurations 73 of the insert are formed with tapered entries 74 which additionally serve to guide the terminal pins 75 of component 72. Should pins 75 be slightly misaligned or bent, tapered entries 74 will tend to straighten and align them during loading of the component onto the receiver. Thus, with components having terminal pins, the component delivery system also incorporates a pin aligning mechanism.

To recapitulate, components are loaded into the ends of the chutes, which are configured to accept them only in a given orientation, and gravity fed to a platform. Operation of an air valve pushes the lower component off the platform into engagment with a receiver, specifically into engagement with mounting means on the receiver that correspond to the component mounting means on the printed circuit board. Another air valve operates to pivot the receiver and thereby bring the component into precise orientation for pick up by the grippers of an insertion head, and subsequent mounting on a circuit board, under control of well-known motion control apparatus. With the invention, one or more delivery systems may be used at work stations for delivering a variety of components with precise orientation for operation with either the same or with different insertion means.

It will be appreciated that numerous modifications in the described embodiment of the invention will be apparent to those skilled in the art without departure from the true spirit and scope thereof. The invention is to limited only as defined in the claims.

I claim:

1. In an automated assembly system including a plurality of components having first mounting means, conveyer means carrying a circuit board to a work station, second mounting means on said circuit board for cooperating with said first mounting means for mechanically and electrically attaching said components to said circuit board, and insertion means for moving components from said work station into position on said circuit board; means for presenting said components to said insertion means with a precise orientation comprising:
    a chute for delivering said components to a platform at said work station with a given orientation;
    a pivotably mounted receiver positioned at said work station adjacent said platform and including means cooperating with said first mounting means for precisely locating said components;
    means sequentially moving components from said platform into engagement with said receiver; and
    means pivotably moving said receiver and said precisely located component into said precise orientation.

2. An automated assembly system as set forth in claim 1 wherein said sequentially moving means includes a horizontally disposed armature for pushing a component from said platform to engage said first mounting means with said cooperating means on said receiver.

3. An automated assembly system as set forth in claim 2, further including an additional armature coupled to said receiver for pivotably moving said receiver from a first position for receiving components from said platform to a second position for presenting components to said insertion means.

4. An automated assembly system as set forth in claim 3 further including stop means for defining said first and said second positions of said receiver.

5. An automated assembly system as set forth in claim 4 wherein said chute and said receiver are removable to permit operation of said system with components having different mounting configurations.

6. An automated assembly system including, a plurality of components having first terminal mounting means, conveyor means carrying a printed circuit board to a work station, second terminal mounting means on said circuit board cooperable with said first terminal mounting means for mechanically and electrically attaching the components to the circuit board, and insertion means for moving components from said work station into mounted position on said circuit board, means for presenting said components to said insertion means with a precise orientation comprising;
    a chute for delivering components with a given orientation to a platform at said work station, said chute having an internal cross sectional area configured to match the outer configuration of said components;
    a pivotably mounted receiver positioned at said work station adjacent said platform and including means cooperating with said first terminal mounting means for precisely locating said components;
    an air valve including an armature for sequentially moving components from said platform into engagement with said receiver; and
    another air valve including an armature for sequentially pivoting said receiver and said precisely located component into said precise orientation.

* * * * *